(12) United States Patent
Shan

(10) Patent No.: US 6,746,950 B2
(45) Date of Patent: Jun. 8, 2004

(54) LOW TEMPERATURE ALUMINUM PLANARIZATION PROCESS

(75) Inventor: Ende Shan, Colorado Springs, CO (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 09/992,743

(22) Filed: Nov. 14, 2001

(65) Prior Publication Data

US 2003/0092255 A1 May 15, 2003

(51) Int. Cl.[7] .......................................... H01L 21/4763
(52) U.S. Cl. ...................... 438/618; 438/637; 438/688
(58) Field of Search .................. 438/618, 637, 438/688, 622–9, 625, 642–4, 648, 672, 679, 680, 681

(56) References Cited

U.S. PATENT DOCUMENTS

| | | | |
|---|---|---|---|
| 5,534,463 A | 7/1996 | Lee et al. | 437/195 |
| 5,968,851 A | 10/1999 | Geha et al. | 438/756 |
| 5,990,011 A | 11/1999 | McTeer | 438/692 |
| 6,140,228 A | 10/2000 | Shan et al. | 438/653 |
| 6,156,645 A | 12/2000 | Geha et al. | 438/648 |
| 6,187,667 B1 | 2/2001 | Shan et al. | 438/636 |
| 6,204,175 B1 * | 3/2001 | Lai et al. | 438/681 |
| 6,271,137 B1 | 8/2001 | Liou et al. | 438/688 |
| 6,274,008 B1 | 8/2001 | Gopalraja et al. | 204/192.17 |
| 6,313,027 B1 | 11/2001 | Xu et al. | |
| 2001/0045661 A1 * | 11/2001 | Yang et al. | 257/763 |

FOREIGN PATENT DOCUMENTS

WO    WO 01/63659    8/2001

* cited by examiner

*Primary Examiner*—Long Pham
*Assistant Examiner*—Ginette Peralta
(74) *Attorney, Agent, or Firm*—Christie, Parker & Hale, LLP

(57) ABSTRACT

A low temperature aluminum planarization process. Vias, including high aspect ratio vias, are filled using a liner layer, a seed layer, and a fill layer. The device associated with the via is exposed to a reactive gas prior to applying the fill layer to the device.

34 Claims, 3 Drawing Sheets

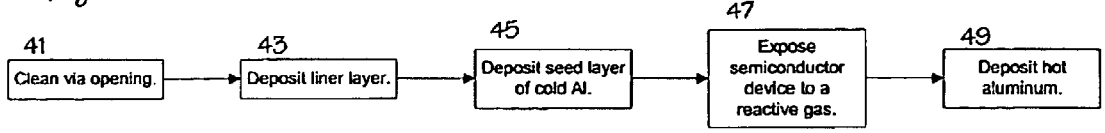
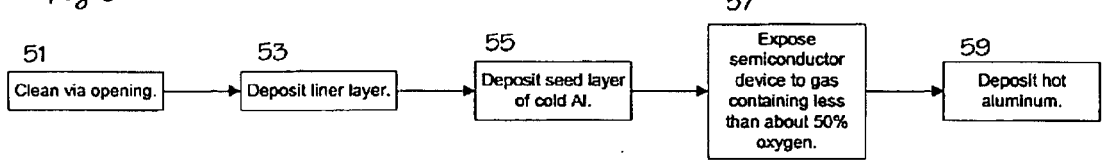
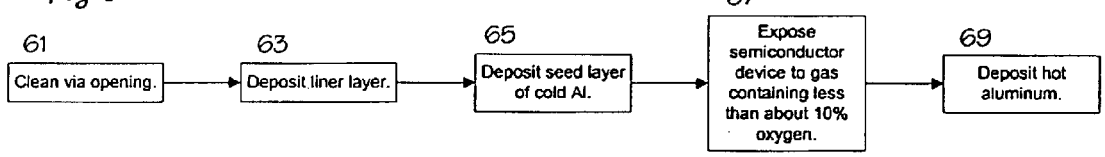
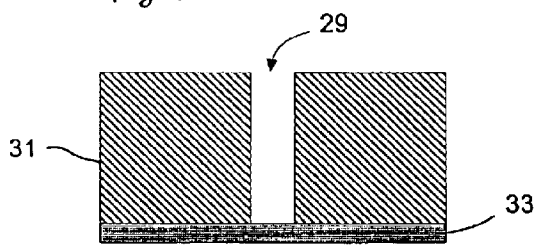
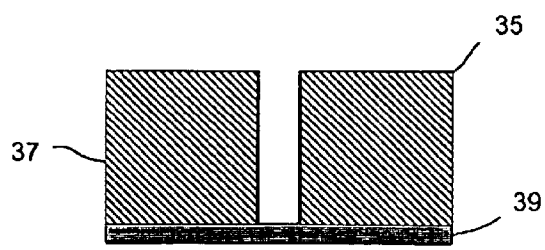

LOW TEMPERATURE ALUMINUM PLANARIZATION PROCESS

BACKGROUND OF THE INVENTION

This invention relates generally to semiconductor fabrication processes, and more particularly to metalization of vias and trenches.

In modern semiconductor fabrication processes, multiple interconnect layers of metal, many times in the form of trenches, are often used to carry signals within a semiconductor device. Each layer is generally separated from the layers immediately above and below by a dielectric layer. However, signals often need to be transmitted between different layers as well as within individual metal layers.

Signal propagation between metal layers is often accomplished using vias. Vias consist of a metal trace, or plug, extending in a substantially vertical direction through a dielectric layer. On each side of the dielectric layer, the metal trace of the via contacts the metal layers separated by the dielectric. In this way, the via serves to electrically couple metal layers that are separated by a dielectric.

To form a via, an aperture is first formed in a dielectric layer, reaching a metal layer below. The via aperture is metalized, or filled with metal, in order to make good ohmic contact with the underlying metal layer. A second metal layer, contacting the via, is deposited above the via. Current is thus free to flow along one metal layer, through the via, and into the second metal layer. In most processes, vias are not restricted to coupling adjacent metal layers. It is possible for vias to couple two metal layers that are separated by one or more intermediate metal layers.

Vias are difficult to fabricate, and are particularly difficult to metalize properly. Properly metalized vias are preferably free from gaps, areas devoid of metalizaion, and areas of partial metalization. An area of a via lacking metalization such that the metal layers on each side of the via are not electrically coupled creates an electrical open circuit. Such an open circuit can lead to the failure of circuitry associated with the via. Partial metalization can increase the resistance associated with a via. Increased resistance in the via can cause associated circuitry to function at a reduced speed, as well as create reliability and other problems. In each of these cases, the semiconductor device may not meet the necessary specifications.

An example of a via containing a void can be seen in FIG. 1. Illustrated in FIG. 1 are two metal layers 2, 4, separated by a dielectric layer 6. A metal filled via 8 couples the two metal layers through the dielectric. The via, however, includes a void 10, with the void being a volume substantially devoid of metal. Thus, current traveling through the via must pass through the region between the periphery of the void 12 and the edge of the via 14. Via resistance may be increased due to the smaller cross-sectional area that the current must pass through. This can adversely affect the performance of the semiconductor device as discussed above. Additionally, due the reduced cross sectional area, the current density in the region adjacent to the void is increased.

Of particular importance in semiconductor fabrication is the yield of a product. Proper fabrication of vias and trenches is an important aspect of maintaining high yields. Product yield is simply the ratio of the number of semiconductor devices that meet specifications to the total number of that particular device that are produced. It is desirable to have as high a yield as possible. Unfilled or partially filled vias and trenches either prevent the semiconductor device from operating properly, or possibly require that the semiconductor device be operated at reduced speeds.

Furthermore, the reliability of semiconductor devices is of great importance. Many devices are expected to provide years of nearly continuous, trouble-free service. A void in a via increases the current density in an area of a via, as discussed above. Increased current density accelerates electromigration, the process by which the flow of current through a conductor gradually severs the conductor. A void and the resulting enhanced electromigration can thus lead to the premature failure of a via. A via failing in such a way often acts as an electrical open circuit, causing problems as previously discussed.

As processes and semiconductor speeds continue to become more aggressive, spacing between metal layers is increasing. That is, thicker dielectrics are often being used. Increased spacing between metal layers decreases parasitic capacitance on signal lines. Lower capacitance frequently allows circuits to be operated at higher speeds. However, as metal spacing increases, the required via height increases as well. Thus the via aspect ratio, the ratio of via height to width, increases. Narrower metal lines on semiconductor devices make smaller via diameters preferable. Each of these trends lead to increased via aspect ratios. As aspect ratios increase, vias generally become more difficult to metalize properly.

In order to completely metalize a via, the metal used, often aluminum, should reach the bottom of the via. As aspect ratios grow it becomes increasingly difficult to ensure that metal reaches and substantially fills the lowest levels of the via. In order to encourage the movement of metal into the bottom of the vias, high temperatures are often employed in the fabrication process. Higher temperatures decrease the viscosity of aluminum and facilitate its movement into and within the vias. These high temperatures cause high stresses to form in the substrate material and previously fabricated layers due to thermal expansion.

Modern semiconductor devices employ a variety of materials in their manufacture. These materials can have widely varying coefficients of thermal expansion. Such materials include aluminum or other metals, silicon dioxide and other dielectrics, silicon or other semiconductors, as well as polycrystalline and other connecting materials. Variations in the coefficients of thermal expansion can lead to different expansions and movements for different sections and materials of the semiconductor device. These differences in expansion and associated movement can cause the severing or degrading of connections within the semiconductor device. Ultimately, this may precipitate the failure of the final product.

BRIEF SUMMARY OF THE INVENTION

The present invention provides a low temperature aluminum planarization process. The process is suitable for forming high aspect ratio vias and trenches. In one embodiment the process comprises a treatment of a semiconductor device so as to allow substantially completely filled vias and trenches. The treatment comprises cleaning an aperture of a semiconductor device, depositing a metal liner layer on the semiconductor device, and depositing a seed layer of aluminum of the metal liner layer. The process further comprises exposing the semiconductor device to a reactive gas, and depositing aluminum on the seed layer to fill the aperture. In one embodiment the via couples a plurality of metal layers through one or more dielectric layers. In a further embodiment the treatment comprises cleaning the via opening by exposing the via aperture and surrounding areas to a cleaning process. In one embodiment the metal liner layer comprises titanium based compounds, and in a further embodiment the metal liner layer includes titanium nitride. In a further embodiment depositing a seed layer of aluminum on the metal liner layer comprises depositing a layer of aluminum on the metal liner layer at a temperature such that the seed layer of aluminum does not amalgamate. In one embodiment the semiconductor device temperature onto which the seed layer of aluminum is deposited is below about 200 degrees centigrade. In a further embodiment exposing the semiconductor device to an atmosphere containing reactive gas comprises exposing the device to an atmosphere containing a mixture of reactive gases and inert gases.

These and other aspects of the present invention may be more readily understood through study of the following detailed description in conjunction with viewing of the accompanying figures.

BRIEF DESCRIPTION OF DRAWINGS

FIG. 4 is a flow diagram of a process used to fabricate a via in accordance with the present invention.

FIG. 5 is a flow diagram of an alternative embodiment of the process of FIG. 5.

FIG. 6 is a flow diagram of a further alternative embodiment of the process of FIG. 5.

FIG. 7 illustrates a cross-section of a semiconductor device with a via formed in an insulator, exposing the underlying metal layer.

FIG. 8 illustrates a cross-section of a semiconductor device with the via and insulator of FIG. 7, to which a liner layer has been deposited.

DETAILED DESCRIPTION

In various embodiments the invention applies to filling of vias and also trenches. The aspects relating to trenches should be apparent in view of the following description, which uses vias for example purposes.

Figure 1:
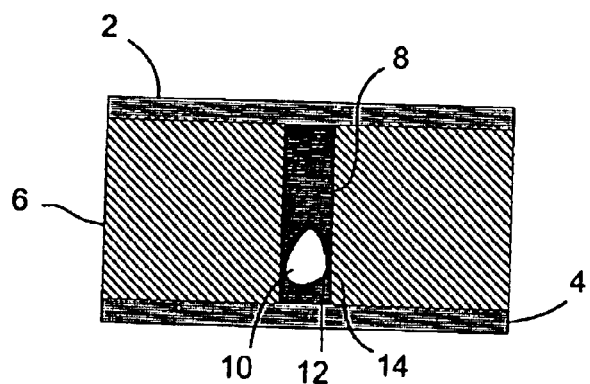
FIG. 1 illustrates a cross-section of a semiconductor device including a via with a void.
Figure 2:
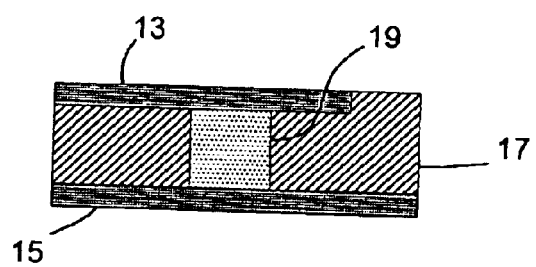
FIG. 2 illustrates a cross-section of a semiconductor device with a via with a low aspect ratio.

A cross sectional diagram illustrating a via with a low aspect ratio can be seen in FIG. 2. In the embodiment illustrated in FIG. 2, two metal layers 13, 15 sandwich a dielectric layer 17. The metal layers are coupled across the dielectric by a via 19. As illustrated, the via height is equal to the via width. Therefore the via has an aspect ratio of one.

Figure 3:
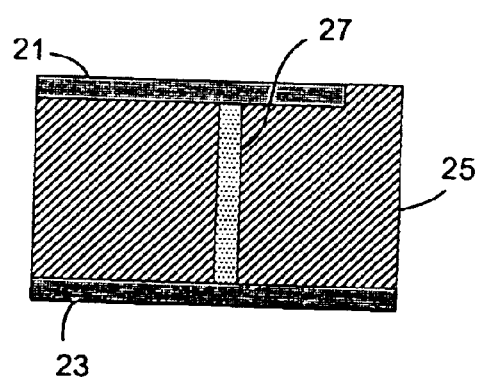
FIG. 3 illustrates a cross-section of a semiconductor device with a via with a higher aspect ratio than the via of FIG. 2.

A cross sectional diagram illustrating a via with a higher aspect ratio than the via of FIG. 2 can be seen in FIG. 3. As illustrated in FIG. 3, two substantially parallel metal layers 21, 23 are separated by a dielectric layer 25. The metal layers are coupled through the dielectric by a via 27. In this embodiment, the via height is much grater than the via width. Consequently, the aspect ratio of the via is much greater than one.

Modern semiconductor devices can require very high via aspect ratios, at times 10 or greater. Vias with a high aspect ratio, such as greater than 2, or greater than 5, or greater than 8, are generally more difficult to metalize properly than vias with low aspect ratios. This is because the metal deposited to fill the via often solidifies before it reaches the bottom of the via. This can result in open circuits or other problems as discussed earlier.

A process of fabricating a via is illustrated in FIG. 4. The process of FIG. 4 is with respect to an aperture previously formed. Such an aperture can be seen in FIG. 7. As illustrated in FIG. 7, an aperture 29 forms an opening in a dielectric layer 31. The aperture extends to and exposes a metal layer 33 underlying the dielectric. The via aperture is formed using any number of techniques well known in the art.

Refering to FIG. 4, the via aperture is cleaned as illustrated in Block 41. Cleaning the aperture substantially removes foreign particles and undesirable material or other process residues that may be present after the via aperture has been formed. In one perphaps more typical embodiment cleaning is performed using a sputter etch or similar process. For example, in one embodiment an inert gas is ionized within a chamber occupied by the device containing the via. In one embodiment the inert gas is argon at pressures from 0.1 mTorr and 50 mTorr. The plasma formed using argon gas provided R.F. power from, in one embodiment, a single electrode providing 0.25 W/cm2 to 25 W/cm2 of wafer surface area. In other embodiments the power is delivered using multiple electrodes, in parallel-plate, inductively coupled plasma, or other configurations known to those of skill in the art.

After the via is cleaned, a liner layer is deposited as is indicated in Block 43. FIG. 8 illustrates an aperture with a thin film liner layer 35. The aperture extends through a dielectric to a metal layer 39. The liner layer covers the surface of a dielectric layer 37 and forms a substantially continuous film in the topography of the via aperture, making good contact with a metal layer 39 at the bottom of the via.

In one embodiment, the liner layer is comprised of titanium or titanium nitride. In another embodiment, the liner layer is comprised of a combination of titanium and titanium nitride. In a further embodiment, the liner layer comprises other titanium containing compounds. The liner layer has good adhesion to the dielectric layer and forms a solid foundation for subsequent fabrication steps. Additionally, the liner layer serves as a good wetting layer, facilitating the movement of aluminum into the via to help ensure that the via is substantially filled.

Figure 9:
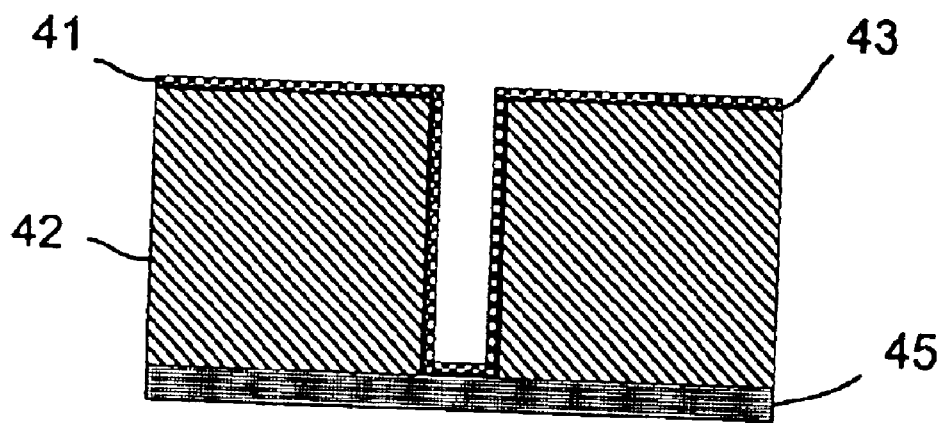
FIG. 9 illustrates the via and surrounding areas of FIG. 8 to which a seed layer of aluminum has been deposited.

Returning again to FIG. 4, in Block 45 a seed layer of cold aluminum is deposited onto the liner layer. A via at this stage of fabrication can be seen in FIG. 9. A seed layer of aluminum 41 overlays a liner layer 43 that was previously deposited. The liner layer covers a surface of a dielectric layer 42. The seed layer forms a film on the surface of the device and throughout the topography of the via. As the seed layer adheres well to the liner layer the seed layer also makes good electrical contact through the seed layer with a metal layer 45 underlying the dielectric. Cold aluminum is deposited at a temperature such that the seed film will not amalgamate. Clusters and the like may obstruct the via aperture. This could interfere with subsequent metalization steps and perhaps prevent substantial filling of the vias.

Consequently, it is possible that the devices may not meet the required specification, and yield could be adversely affected.

In order to reduce the tendency of the aluminum to quickly amalgamate, the wafer temperature onto which the seed layer of aluminum is deposited is preferably below about 300☐ C. To further reduce the possibility of amalgamation, the wafer temperature onto which the seed layer of aluminum is deposited is most preferably below about 200° C. In one embodiment the aluminum is deposited by way of physical vapor deposition. In another embodiment the aluminum is deposited by way of chemical vapor deposition.

As illustrated in Block 47 of FIG. 4, once the seed layer of aluminum is deposited, the device is exposed to a reactive gas. The pressure of the reactive gas containing atmosphere to which the device is exposed is preferably less than about 100 mTorr. Most preferably, the pressure of the reactive gas containing atmosphere to which the device is exposed is less than about 10 mTorr. The length of exposure of the device to the reactive gas is preferably less than about 5 minutes. Most preferably, the length of exposure of the device to the reactive gas is less than about 1 minute.

The reactive gas that the device is exposed to is, in varying embodiments, contained in an atmosphere that comprises the reactive gas mixed with other gases. In one embodiment the atmosphere is a mixture of reactive gasses mixed with inert gasses. The reactive gas containing atmosphere preferably contains less than about 50% by weight of the reactive gas. Most preferably the reactive gas containing atmosphere contains less than about 10% by weight of the reactive gas. Preferably, the atmosphere is substantially comprised of the reactive gas and inert gasses. Most preferably the atmosphere comprises oxygen as the reactive gas mixed with argon forming the balance.

Once the device has been exposed to the reactive gas, a fill layer of aluminum is deposited to substantially fill the via in Block 49. During the deposition of fill layer, the wafer temperature is between about 350° C. and 550° C. In one embodiment, the wafer temperature during the deposition of the fill layer is between about 400° C. and about 500° C. In another embodiment, the wafer temperature during the deposition of the fill layer between about 420° C. and about 480° C. In one embodiment the fill layer is deposited using a sputtering technique, with DC power in the range of 200 w to 10 kw, and preferably in the range of 500 w to 3 kw.

Figure 10:
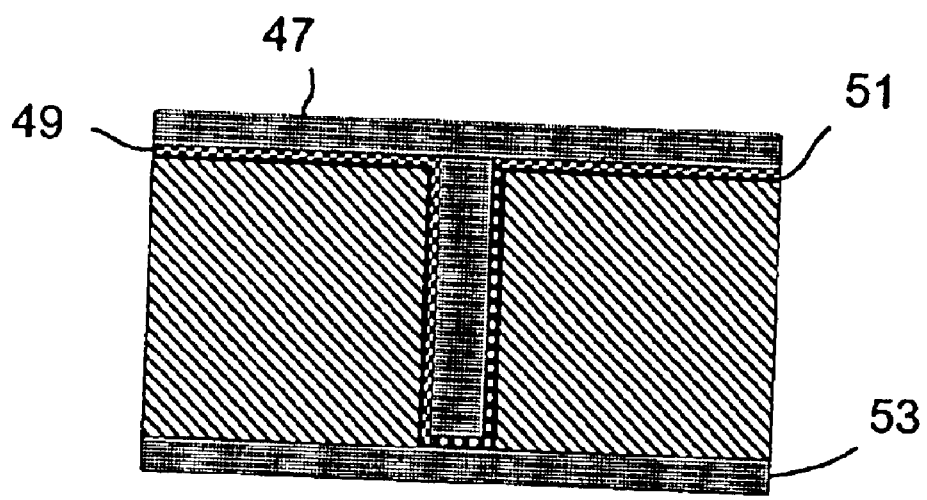
FIG. 10 illustrates a cross-section of a semiconductor device with the via and surrounding area of FIG. 9, to which a subsequent layer of aluminum has been deposited.

As can be seen in FIG. 10, a final layer 47 overlays a seed layer 49 deposited in the previous step. The seed layer makes good contact with both the final layer and the liner layer 51. In this way good electrical contact is provided between the fill layer and the previous metal layer 53. Current can thus flow in the previous metal layer, through the via, and into the subsequent metal layer of the device. Thus the via electrically couples the two metal layers and their associated circuitry. Additional dielectric and metal layers can be deposited on the fill layer, to allow for further connectivity among circuits on the device.

FIG. 5 illustrates a further embodiment of the present invention. In the embodiment of FIG. 5, a previously formed via opening is cleaned in Block 51. In Block 53 a liner layer is deposited in the aperture. In Block 55 a seed layer is deposited on the liner layer. The previous discussion with respect to the process of FIG. 4, particularly Blocks 41, 43, and 45, also applies to the process of FIG. 6.

In the embodiment of FIG. 5, in Block 57 the atmosphere contains less than about 50% oxygen by weight as the reactive gas. As can be seen in Block 69, once the device has been exposed the oxygen-containing atmosphere, a fill layer of aluminum is deposited. Depositing of the fill layer is as discussed with respect to Block 49 of FIG. 4. The fill layer substantially fills the via.

In yet another embodiment, illustrated in FIG. 6, the previously formed via aperture is cleaned in block 61. A liner layer is deposited in the via, as shown in Block 63. In Block 65 a seed layer is deposited on the liner layer. The previous discussion with respect to the process of FIG. 4, particularly Blocks 41, 43, and 45, also applies to the process of FIG. 6.

In the embodiment of FIG. 6, in block 67 the atmosphere contains less than about 10% oxygen by weight as the reactive gas. As illustrated in Block 69, once the device has been exposed the oxygen-containing atmosphere, a fill layer of aluminum is deposited. Depositing of the fill layer is as discussed with respect to Block 49 of FIG. 4. The fill layer substantially fills the via. Additional metal and dielectric layers can be deposited, allowing for further connectivity among circuits on the device.

The present invention therefore provides a low temperature aluminum planarization process. Although the invention has been discussed with respect to certain specific embodiments, it should be recognized that the invention may be practiced otherwise than as described. Accordingly, the invention should be viewed as defined by the following claims and their equivalents, and the claims supported by this specification.

What is claimed is:

1. A treatment of a semiconductor device so as to allow substantially completely filled vias, the treatment comprising:
   depositing a metal liner layer comprising titanium nitride on a semiconductor device including an aperture;
   depositing, using physical vapor deposition, a seed layer of aluminum on the metal liner layer with the temperature of the semiconductor device below 300 degrees centigrade;
   exposing the seed layer of aluminum to a reactive gas; and
   depositing, using a sputtering technique, aluminum on the seed layer, with the temperature of the semiconductor device greater than 350 degrees centigrade, to fill the aperture, whereby the aperture is substantially filled, creating a via.

2. The semiconductor device of claim 1 wherein the via couples a plurality of metal layers through one or more dielectric layers.

3. The treatment of claim 1 wherein depositing a metal liner layer comprises depositing a metal liner layer into the via and onto the surface of a dielectric layer that the via is formed in, the metal liner layer forming a substantially continuous film throughout the topography of the via.

4. The treatment of claim 1 wherein the depositing a seed layer of aluminum on the metal liner layer comprises depositing a layer of aluminum on the metal liner layer at a temperature such that the seed layer of aluminum does not amalgamate.

5. The treatment of claim 4 wherein the semiconductor device temperature onto which the seed layer of aluminum is deposited is below about 200 degrees centigrade.

6. The treatment of claim 1 wherein exposing the seed layer of aluminum to an atmosphere containing a reactive gas comprises exposing the device to an atmosphere containing a mixture of reactive gasses and inert gasses.

7. The treatment of claim 6 wherein the reactive gas containing atmosphere contains oxygen mixed with inert gasses.

8. The treatment of claim 7 wherein the reactive gas containing atmosphere contains oxygen mixed with argon.

9. The treatment of claim 8 wherein the reactive gas containing atmosphere contains less than about 50% oxygen by weight.

10. The treatment of claim 8 wherein the wherein the reactive gas containing atmosphere contains less than about 10% oxygen by weight.

11. The treatment of claim 6 wherein the reactive gas containing atmosphere is at a pressure of less than about 100 mTorr.

12. The treatment of claim 6 wherein the reactive gas containing atmosphere is at a pressure of less than about 10 mTorr.

13. The treatment of claim 6 wherein the semiconductor device is exposed to the reactive gas containing atmosphere for a period of time preferably less than about 5 minutes.

14. The treatment of claim 6 wherein the semiconductor device is exposed to the reactive gas containing atmosphere for a period of time most preferably less than about 1 minute.

15. The treatment of claim 1 wherein the wafer temperature onto which the aluminum is deposited is preferably between about 400 degrees centigrade and about 500 degrees centigrade.

16. The treatment of claim 1 wherein the wafer temperature onto which the aluminum is deposited is between about 420 degrees centigrade and about 480 degrees centigrade.

17. A process of fabricating vias and trenches in a semiconductor device, the process comprising:

applying a metal liner layer comprising titanium nitride to a surface and into an aperture of a semiconductor device;

applying, using physical vapor deposition, a seed layer of aluminum onto the metal liner layer with the temperature of the semiconductor device being below 300 degrees centigrade;

treating the seed layer of aluminum with a reactive gas; and depositing, using a sputtering technique, a layer of aluminum onto the seed layer with the temperature of the semiconductor device being greater than 350 degrees centigrade.

18. The semiconductor device of claim 17 wherein the device includes a plurality of metal layers and at least one dielectric layer.

19. The process of claim 17 wherein applying a metal liner layer comprises applying a metal layer onto the surface of the semiconductor device and into the previously formed aperture, the metal liner layer forming a substantially continuous layer over the surfaces of the device and aperture.

20. The process of claim 17 wherein depositing a seed layer of aluminum on the metal liner layer comprises depositing a layer of aluminum on the metal liner layer such that the seed layer forms a substantially continuous layer throughout the surfaces of the apertures and the semiconductor device.

21. The process of claim 20 wherein the seed layer is deposited at a temperature such that the seed layer of aluminum will not amalgamate.

22. The process of claim 20 wherein the seed layer of aluminum is deposited onto a semiconductor device with temperature below about 200 degrees centigrade.

23. The process of claim 17 wherein treating the semiconductor device with a reactive gas comprises placing the semiconductor device in an atmosphere containing one or more reactive gasses.

24. The process of claim wherein 23 wherein the atmosphere contains oxygen mixed with inert gasses.

25. The process of claim 24 wherein the atmosphere contains oxygen mixed with argon.

26. The process of claim 25 wherein the atmosphere contains less than about 50% oxygen by weight.

27. The process of claim 26 wherein the atmosphere contains less than about 10% oxygen by weight.

28. The process of claim 23 wherein the atmosphere the semiconductor device is exposed to is at a pressure of less than about 100 mTorr.

29. The process of claim 23 wherein the atmosphere the semiconductor device is exposed to is at a pressure of less than about 10 mTorr.

30. The process of claim 23 wherein the length of exposure of the semiconductor device to the atmospheres is less than about 5 minutes.

31. The process of claim 23 wherein the length of exposure of the semiconductor device to the atmospheres is less than about 1 minute.

32. The process of claim 17 wherein the temperature of the semiconductor device at the time of aluminum deposition is between about 400 degrees centigrade and about 500 degrees centigrade.

33. The process of claim 17 wherein the temperature of the semiconductor device at the time of aluminum deposition is between about 420 degrees centigrade and about 480 degrees centigrade.

34. A process of forming vias and trenches on a semiconductor device that allows for vias and trenches with width of less than about 0.18 µm and with an aspect ratio of greater than about 6:1 to be substantially filled and substantial filling of large vias and trenches comprising depositing, using physical vapor deposition, a seed layer of cold aluminum on a metal liner layer comprising titanium nitride, exposing the seed layer to a reactive gas containing atmosphere, and depositing, using a sputtering technique, hot aluminum on the seed layer.

* * * * *